(12) United States Patent
Korber

(10) Patent No.: US 9,203,129 B2
(45) Date of Patent: Dec. 1, 2015

(54) INCREASING THE MINIMUM REJECTION BANDWIDTH OF A YIG-TUNED NOTCH FILTER USING A SHUNT YIG RESONATOR

(71) Applicant: Teledyne Wireless, LLC, Thousand Oaks, CA (US)

(72) Inventor: Marinus L. Korber, San Carlos, CA (US)

(73) Assignee: TELEDYNE WIRELESS, LLC, Thousand Oaks, CA (US)

( * ) Notice: Subject to any disclaimer, the term of this patent is extended or adjusted under 35 U.S.C. 154(b) by 493 days.

(21) Appl. No.: 13/632,911

(22) Filed: Oct. 1, 2012

(65) Prior Publication Data
US 2014/0091882 A1 Apr. 3, 2014
US 2014/0253261 A2 Sep. 11, 2014

(51) Int. Cl.
*H01P 1/218* (2006.01)
*H01P 1/201* (2006.01)
*H03H 7/01* (2006.01)

(52) U.S. Cl.
CPC ............... *H01P 1/201* (2013.01); *H01P 1/218* (2013.01); *H03H 2007/013* (2013.01)

(58) Field of Classification Search
CPC ............ H01P 1/217; H01P 1/218; H01P 7/00
USPC ...................... 333/202, 219, 219.2
See application file for complete search history.

(56) References Cited

U.S. PATENT DOCUMENTS 4,137,470 A * 1/1979 Desormiere et al. ............ 310/26
6,320,479 B1 * 11/2001 Alers et al. .................... 333/154
6,404,302 B1 * 6/2002 Satoh et al. ................... 333/193

OTHER PUBLICATIONS

Smole et al, Magnetically Tunable Saw-Resonator, 2003, IEEE, pp. 903-906.*

* cited by examiner

*Primary Examiner* — Robert Pascal
*Assistant Examiner* — Gerald Stevens
(74) *Attorney, Agent, or Firm* — K&L Gates LLP

(57) ABSTRACT

A Yttrium Iron Garnet (YIG) tuned band reject filter using one or more Shunt YIG resonators provides for much wider minimum rejection bandwidths without increasing maximum 3 db bandwidths or spurious response. Various configurations of a tunable shunt YIG tuned band reject filter achieves a wide rejection bandwidth at the low end of the tuning range while keeping the maximum 3 db bandwidth, normally occurring at the high end of the tuning range, to a minimum.

25 Claims, 10 Drawing Sheets

ALSO LOW SHUNT Z
ABOVE YIG RESONANCE

HI SHUNT Z
AT YIG RESONANCE

INCREASING THE MINIMUM REJECTION BANDWIDTH OF A YIG-TUNED NOTCH FILTER USING A SHUNT YIG RESONATOR

BACKGROUND OF THE DISCLOSURE 1.0 Field of the Disclosure

The disclosure is directed generally to a method and apparatus for tunable notch filters and, more particularly, to a method and apparatus for microwave tunable notch filters, tunable oscillators and tunable filters, and the like, employing Yttrium Iron Garnet (YIG) spheres.

2.0 Related Art

Yttrium Iron Garnet (YIG) filters may include YIG tuned band pass or YIG tuned band reject filters. YIG tuned band reject filters may be know also as YIG tuned notch filters. A fixed tuned non-YIG notch filter is used throughout the realm of electronics. For example, a non-YIG notch filter might be used to block data noise in household digital subscriber line (DSL) systems. Also, a non-YIG notch filter may also be used as a fixed frequency filter in sophisticated microwave systems to block an unwanted high power signal while passing another signal at a close frequency.

YIG tuned notch filters serve a similar purpose in the microwave realm, e.g., about 500 MHz to about 50 GHz. A basic difference, however, is the ability if a YIG tuned notch filter to tune over a wide frequency range and not just reject a "fixed" band of frequencies, as occurs in fixed tuned non-YIG notch filter, for example. In one aspect, it is this frequency agility of YIG tuned filters that make this technology advantageous and appealing.

In a military application, such as a self-protection jammer, for example, the YIG tuned notch filter may be part of a system that protects the aircraft's surveillance receiver from being overloaded or damaged by the airplane's own high power fire control radar, and since the fire control radar may be "hopping around" to different frequencies, the YIG notch filter may be an ideal protection device since, in turn, it can be tuned to these frequencies and jam a high power signal.

A notch filter, fixed tuned or YIG tuned has both a pass band and a stop band or notch. The pass band is typically very wide and is the band over which the input RF-signal may pass with the lowest possible attenuation. The stop band (the notch) is typically very narrow, relative to the pass band, and in the case of a YIG tuned notch filter, the frequency range over which the notch tunes may or may not be coincident with the pass band range, but will always be within the pass band tuning range.

Accordingly, there is a need for a better technique for providing a YIG tuned notch filter in which the minimum rejection bandwidth increases while the maximum 3 dB Notch bandwidth over the tuning band decreases.

SUMMARY OF THE INVENTION

The disclosure meets the foregoing need and provides for an improved YIG tuned band reject filter. The improved YIG band reject filter provides a much reduced ratio between the minimum rejection bandwidth and the maximum 3 dB bandwidth across the entire band. By arranging some or all YIG resonators in a shunt resonance configuration, a new type of YIG tuned band reject filter with a much wider minimum reject bandwidth (as compared with prior available filters) may be achieved. Moreover, a much narrower maximum 3 dB bandwidth and much lower tracking spur amplitude may be achieved.

In one aspect, a filter is provided comprising a plurality of Yttrium Iron Garnet (YIG) resonators arranged in series and at least one YIG resonator configured as at least one shunt to the plurality of YIG resonators arranged in series to provide a tunable filter. The tunable filter may comprise a band reject filter having a wider minimum rejection bandwidth while having a narrower maximum 3 db bandwidth, as compared with a conventional YIG Tuned Notch filter in which all the YIG resonators are connected in series.

In one aspect a filter may be provided that includes a plurality of impedance inverters in series, and at least one shunt Yttrium Iron Garnet (YIG) resonator connected between at least two of the plurality of impedance inverters.

In one aspect, a filter is provided that includes a plurality of Yttrium Iron Garnet (YIG) resonators arranged in series and at least one YIG resonator configured as at least one shunt to the plurality of YIG resonators arranged in series to provide a tunable filter, wherein the tunable filter provides a notch that decreases in depth and width as frequency increases.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the invention. No attempt is made to show structural details of the disclosure in more detail than may be necessary for a fundamental understanding of the disclosure and the various ways in which it may be practiced. In the drawings.

DETAILED DESCRIPTION OF THE INVENTION

Figure 1:
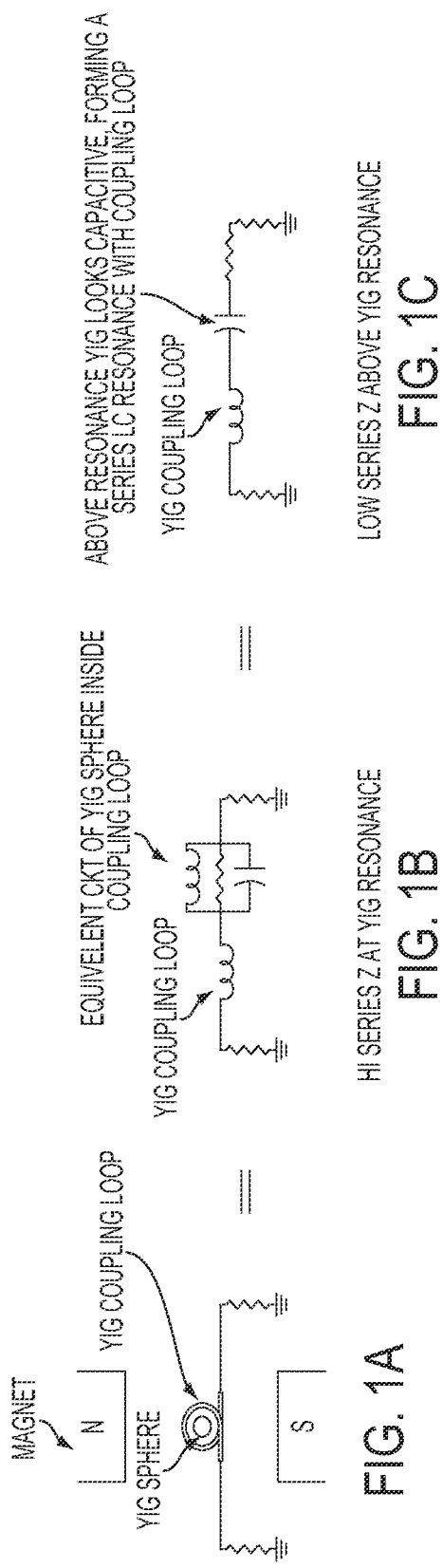
FIG. 1A is an illustration of a YIG resonator in magnetic air gap, according to the prior art.
FIG. 1B is a schematic of an equivalent circuit of FIG. 1A.
FIG. 1C is a schematic showing an equivalent circuit of FIG. 1B above resonance.

It is understood that the disclosure is not limited to the particular methodology, protocols, etc., described herein, as these may vary as the skilled artisan will recognize. It is also to be understood that the terminology used herein is used for the purpose of describing particular examples only, and is not intended to limit the scope of the disclosure. It is also to be noted that as used herein and in the appended claims, the singular forms "a," "an," and "the" include the plural reference unless the context clearly dictates otherwise. Thus, for example, a reference to "a YIG resonator" may be a reference to one or more YIG resonators and equivalents thereof known to those skilled in the art.

Unless otherwise defined, all technical and scientific terms used herein have the same meanings as commonly understood by one of ordinary skill in the art to which the disclosure pertains. The examples of the disclosure and the various features and advantageous details thereof are explained more fully with reference to the non-limiting examples that are described and/or illustrated in the accompanying drawings and detailed in the following description. It should be noted that the features illustrated in the drawings are not necessarily drawn to scale, and features of one example may be employed with other examples as the skilled artisan would recognize, even if not explicitly stated herein. Descriptions of well-known components and processing techniques may be omitted so as to not unnecessarily obscure the examples of the disclosure. The examples used herein are intended merely to facilitate an understanding of ways in which the disclosure may be practiced and to further enable those of skill in the art to practice the examples of the disclosure. Accordingly, the examples herein should not be construed as limiting the scope of the invention, which is defined solely by the appended claims and applicable law. Moreover, it is noted that like reference numerals reference similar parts throughout the several views of the drawings.

In general, for many applications, a significant requirement for a YIG tuned notch filter is to have a wide minimum rejection bandwidth, typically at the 40 db rejection point, although it could be at other rejection points such as the 30 dB or the 50 dB, depending on a specific application requirement, for example. Another significant requirement of the same YIG tuned notch filter may include that the maximum 3 dB bandwidth throughout the band be kept to a minimum. Moreover, another significant requirement for a YIG tuned notch filter may include that the tracking spur amplitude be kept to a minimum. In prior art solutions, these requirements typically conflict with each other. In the prior art, coupling a YIG-tuned band reject filter for a wider minimum rejection bandwidth has a detrimental effect filter performance by widening the 3 dB bandwidth and increasing tracking spur amplitude.

In one aspect, the present disclosure provides an improved YIG tuned band reject filter that is configured to provide a much reduced ratio between the minimum rejection bandwidth and maximum 3 dB bandwidth across the entire band. By using one or more YIG resonators in a shunt resonance configuration, a new type of YIG tuned band reject filter with a much wider minimum rejection bandwidth (compared to prior art filters) and at the same time a much narrower maximum 3 dB bandwidth and much lower tracking spur amplitude may be achieved.

FIG. 1A is an illustration of a YIG resonator in magnetic air gap; FIG. 1B is a schematic of an equivalent circuit of FIG. 1A, and FIG. 1C is a schematic showing an equivalent circuit of FIG. 1B above resonance. The inductor, capacitor and resistor of the YIG resonator equivalent circuit of FIG. 1B represent intrinsic inductor, capacitor and resistor values of the YIG resonator. The actual values of the inductor, capacitor and resistor of the YIG resonator may be understood to be dependent on factors such as resonator size, unloaded Q, operating frequency, and other factors such as coupling loop diameter. The YIG resonator of FIGS. 1A-1C may be serially connected between a source and a load.

FIG. 1A illustrates a physical representation of a single resonator in a magnet air gap that may comprise an electromagnetic with air gap, and a single YIG sphere surrounded by a wire "coupling loop." The YIG sphere inside the wire loop in FIGS. 1A and 1B may be serially connected between a source and load such as represented by the respective source and load resistors. The parallel resonant circuit if FIG. 1B represents the YIG resonator. The YIG resonator resonant frequency is a linear function of the magnetic field strength in the air gap. The input impedance of the parallel resonant circuit of FIG. 1B is very high at resonance and very low away from resonance. Therefore, it makes a suitable tunable notch filter, as the high impedance at resonance of the circuit of FIG. 1B blocks a narrow band of frequencies from passing from the source to the load through the resonator, and the narrow band to be blocked can be different depending on the frequency to which the YIG sphere is tuned. The low impedance outside of resonance passes signals with little attenuation.

FIG. 1C shows the electrically equivalent circuit of the YIG parallel resonance on the high side of the resonance center frequency. The high side of the YIG resonance, or of any parallel resonant circuit, behaves like a frequency sensitive capacitor. The capacitance is in series with the YIG coupling loop inductance. The series combination forms a series resonant circuit. The series resonance shown in FIG. 1C may not be very significant in standard prior art performance YIG tuned reject performance, but is a significant aspect for a shunt YIG tuned band reject filter, when configured according to principles of the invention.

Figure 2:
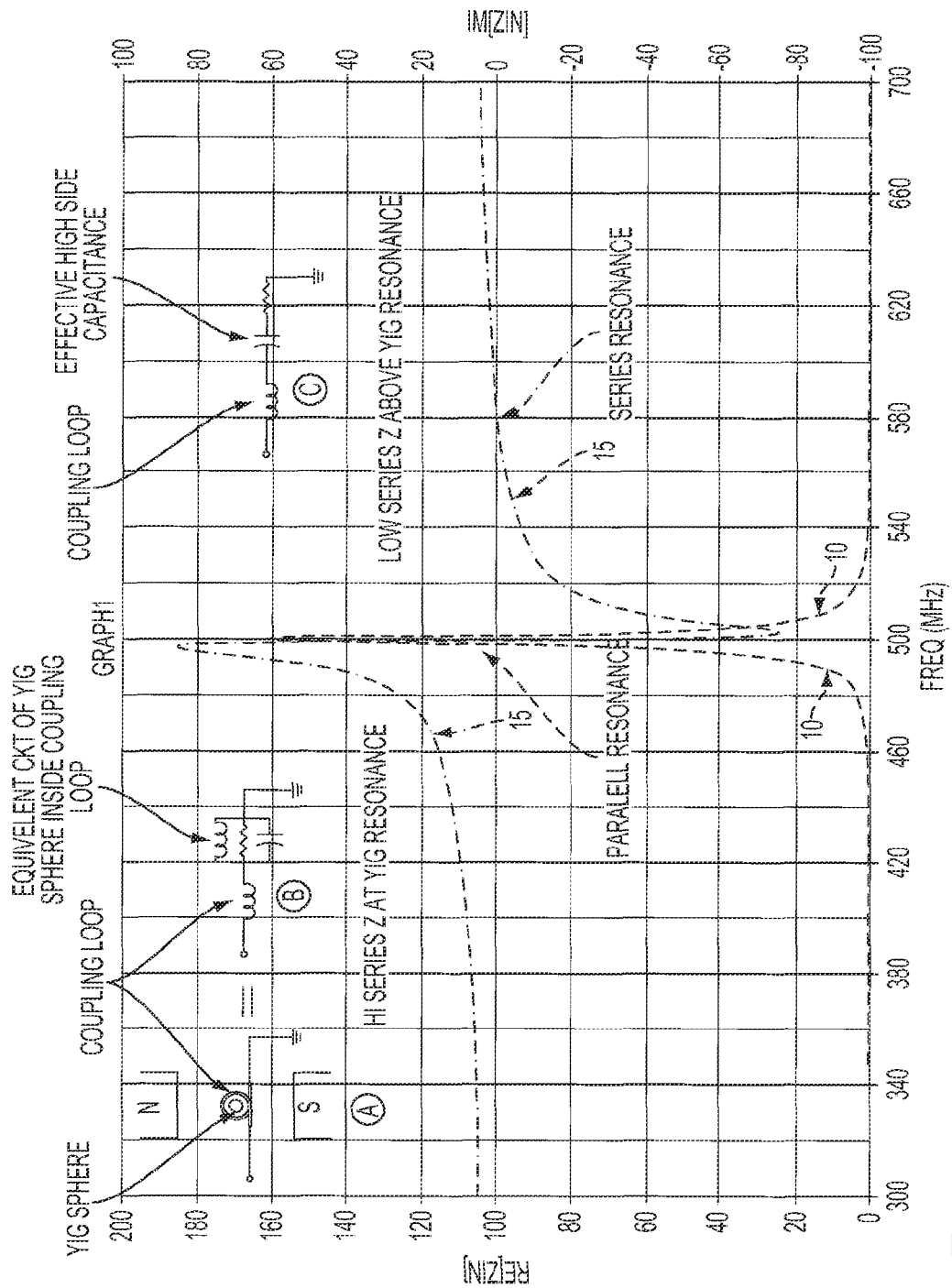
FIG. 2 is an exemplary graph illustratively showing the simulated electrical behavior of a YIG resonator as a one port circuit showing both real and imaginary part of the YIG resonator frequency response.

FIG. 2 is an exemplary graph illustratively showing the simulated electrical behavior of a YIG resonator as a one port circuit showing real and imaginary part of the YIG resonator frequency response. The graph of FIG. 2 is a simulation of circuit B of FIG. 2, which is an equivalent circuit of the physical circuit A of FIG. 2, while circuit C of FIG. 2 represents the electrical equivalent of circuit B above resonance. Circuit B is electrically equivalent of circuit A and comprises a wire YIG coupling loop inductance in series with the YIG sphere (resonator) parallel resonant circuit represented schematically by an inductance, a capacitance and a resistance in parallel. The parallel resonance circuit represents the YIG resonator. Below resonance, a parallel resonant circuit looks like a frequency sensitive inductor. At resonance, a parallel resonator has a purely resistive impedance. Above resonance, the YIG resonator of circuit A and circuit B looks like a frequency sensitive capacitor. Above resonance, the coupling loop inductance and that equivalent above resonance capacitance form the series resonance circuit C. A parallel resonator looks like a frequency sensitive capacitor above resonance, which is a significant aspect to understanding the principles of the invention.

The graph of FIG. 2 shows a real part of the input impedance, RE(ZIN), as line 10 and also an imaginary part of the input impedance, IM(ZIN), as line 15. The imaginary part 15 of the input impedance IM(ZIN) of the YIG parallel resonator is inductive below resonance and capacitive above resonance. The wire coupling loop has inductance. The YIG resonator as noted above and seen in the graph of FIG. 2 looks like a capacitor on the high-side of the YIG's parallel resonance. The combination of the coupling loop inductance in series with the equivalent capacitance on the high-side of the YIG resonance form a series resonance circuit as shown in circuit C of FIG. 2. This series resonance remains at a substantially fixed offset from the center frequency of the main YIG resonance as it tunes over any particular frequency range. This series resonance may be seen on the graph of FIG. 2 where the imaginary part of the impedance travels through zero. This series resonance remains at a substantially fixed offset from the main YIG resonance as the main resonance is tuned through the band. This series resonance is well known in the art and is generally considered an unwanted parasitic that degrades the performance of YIG tuned band pass filters and plays a small role in notch shape of prior art YIG-tuned band reject filters. However, this series resonance provides a significant aspect to understanding the principles for a shunt YIG-tuned band reject filter configured according to principles of the invention.

Figure 3C:
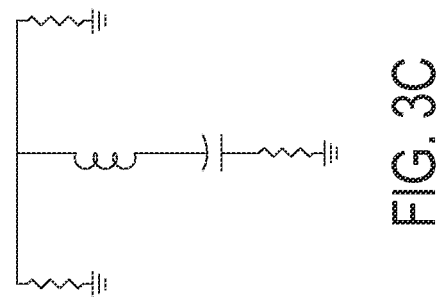
FIGS. 3A-3C are schematics of a shunt connected YIG resonator, according to principles of the invention.
Figure 3B:
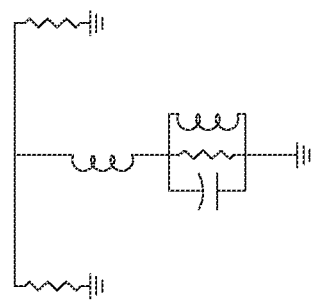
Figure 3A:
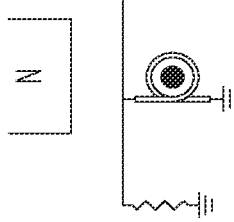

FIGS. 3A-3C are schematics of a shunt connected YIG resonator, according to principles of the invention. FIG. 3A shows a physical representation of a YIG sphere inside a coupling loop placed in shunt with a source and load. FIG. 3B is an electrical schematic and is the equivalent circuit of FIG. 3A. FIG. 3C is a schematic of an equivalent of FIG. 3B when modeled above the center of FIG. 3B's main resonance, and is also a resonant circuit as understood by those skilled in the art. FIG. 3C is a series resonant circuit placed in shunt with a source and load. A series resonance circuit acts like a low impedance at resonance. This low impedance reflects much of the energy coming from the source back to the source and blocks it from reaching the load. Some energy is also dissipated in the resonator. Also, since the series resonance of FIG. 3C is a result of the YIG coupling loop inductance resonating with the YIG resonator's high side capacitance, it provides a tunable band reject or notch filter. The notch depth and notch width decreases with increasing frequency. This behavior (decreasing notch depth with increasing frequency) may be explained by the fact that the impedance of the YIG resonator at resonance and off resonance, at a fixed offset, increases with increasing frequency. The measured notch frequency response of the shunt band reject filter of FIG. 3B is explained more fully in reference to FIGS. 5A-5D below.

Figure 4A:
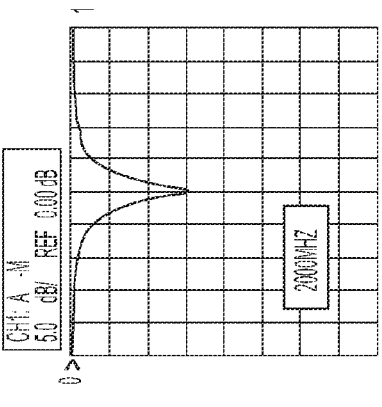
FIGS. 4A-4D are graphs showing measured frequency response of the conventional 500 MHz to 2 GHz YIG tuned band reject resonator of FIGS. 1A-1C.
Figure 4B:
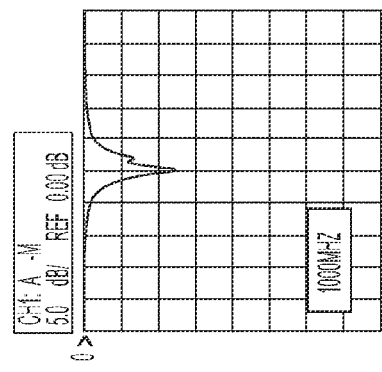
Figure 4C:
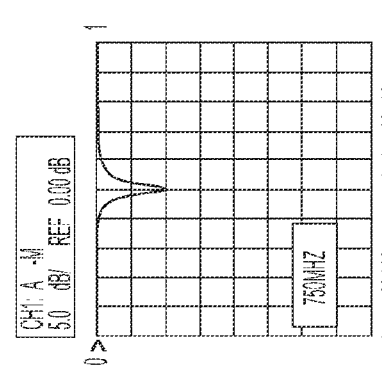
Figure 4D:
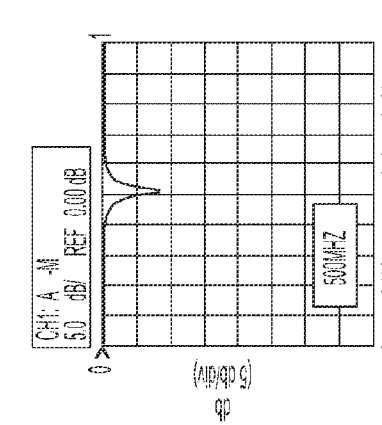
Figure 5A:
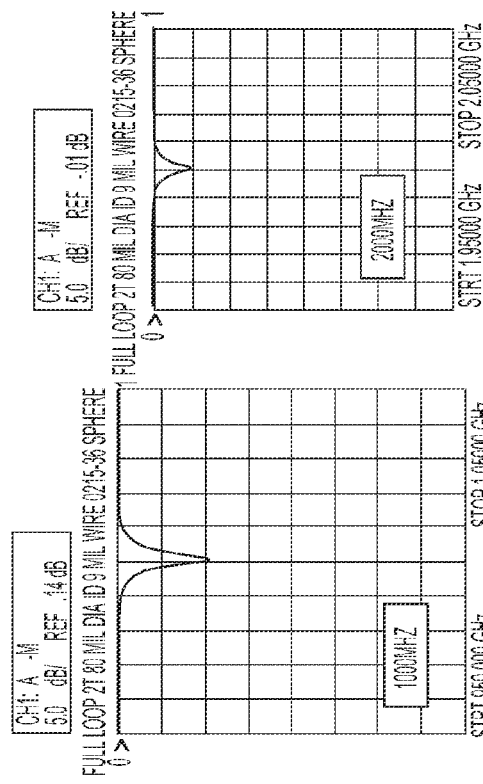
FIGS. 5A-5D are graphs representing measured results of the tunable band reject filter of FIGS. 3A-3C.
Figure 5B:
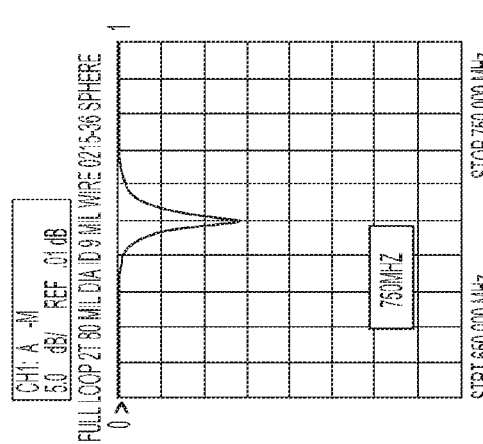
Figure 5C:
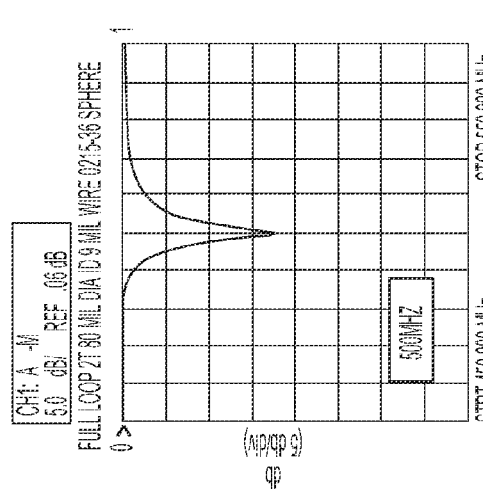
Figure 5D:
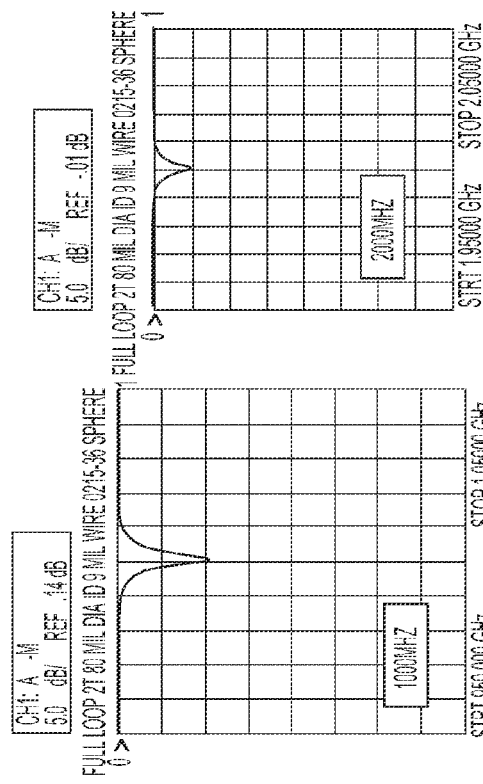

FIGS. 4A-4D are graphs showing measured frequency response (S21) of the band reject filter of FIG. 1B. FIGS. 4A-4D show an example of a resulting notch of the series connected YIG resonator of FIG. 1B as a function of frequency. The resulting notch of these examples may be centered at, for example, 500 MHz, 750 MHz, 1000 MHz and 2000 MHz respectively. The minimum notch depth always takes place at the low end of the tuning range, in this series of examples, at about 500 MHz shown in FIG. 4A, and the maximum notch depth always takes place at the high end, in this example, at about 2 GHz as shown in FIG. 4D. The series YIG resonance may have a high impedance at resonance thereby resulting in a notch that increases in depth with increasing frequency (e.g., from 500 MHz of FIG. 4A to 2000 MHz of FIG. 4D). This behavior (increasing notch depth with increasing frequency) may be explained by the fact that the impedance of the YIG resonator at resonance and off resonance increases with increasing frequency. The divisions of the y-axis each represent e.g., 5 db and the divisions of the x-axis each may represent e.g., 10 MHz in FIGS. 4A-4D.

FIGS. 5A-5D are graphs representing measured notch frequency response of the shunt connected YIG resonator of FIG. 3B, according to principles of the invention. This is the measured frequency response (S21) of a single shunt resonator YIG tuned band reject filter. Unlike the prior art circuitry frequency response shown in FIGS. 4A-4D, the shunt connected YIG resonator of FIG. 3B has its maximum notch depth and bandwidth at the low end of the tuning range (see, FIG. 5A) and the notch depth and notch bandwidth decrease with increasing frequency (see, FIGS. 5B-5D). This behavior (i.e., decreasing notch depth with increasing frequency) may be explained by the fact that the impedance of the YIG resonator at resonance and off resonance, at a fixed offset, increases with increasing frequency. The divisions of the y-axis may represent 5 db and the divisions of the x-axis represent e.g., 10 MHz in FIGS. 4A-4D.

Figure 6:
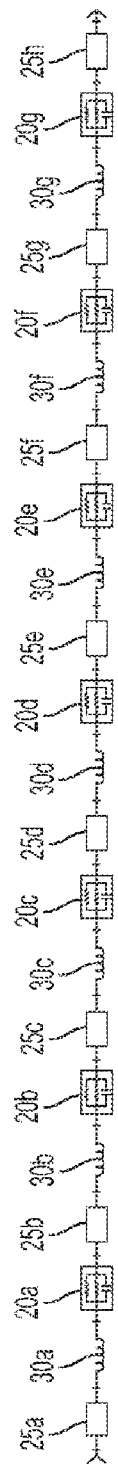
FIG. 6 shows an example schematic drawing of a seven stage conventional YIG tuned band reject filter, according to the prior art.

FIG. 6 shows an example schematic drawing of a seven stage conventional YIG tuned band reject filter 100, according to the prior art. Practical YIG tuned band reject filters of the prior art may have many single resonators, e.g., multiple single resonator band reject filters of FIGS. 1A and 1B connected in series. (A single resonator band reject filter of FIGS. 1A and 1B typically does not have a wide enough rejection bandwidth or notch depth to serve usefully in typical applications where a wide notch bandwidth and deep notch are required to block interfering signals). This series configuration may create a notch filter with a much wider rejection bandwidth and notch depth. The seven stage conventional YIG tuned band reject filter 100 may comprise YIG resonators 20a-20g, quarter wave impedance inverters 25b-25g, YIG resonator coupling loops 30a-30g and input/output matching lines 25a and 25h. The filter 100 is an example of a prior art filter that may have a notch that can tune from about 500 MHZ to about 2.6 GHZ. The YIG resonators 20a-20g may be separated by a length of transmission line that is a quarter wave long toward the upper end of the tuning range and may serve as an impedance inverter between YIG resonators 20a-20g and also part of the matching network to insure a low loss pass band. The measured frequency response of the prior art filter 100 of FIG. 6 is shown in relation to FIGS. 8-11, as explained more fully below. FIGS. 8-11 also show the measured frequency response of circuit 120 of FIG. 7, which is configured according to principles of the invention, as explained more fully below.

YIG tuned band reject filters are typically specified to have a minimum rejection bandwidth and a maximum 3 dB bandwidth in the entire tuning band. The filter 100 of FIG. 6 is an example of the state of the prior art. The filter 100 has a minimum 40 dB rejection bandwidth of 4.4 MHz at 500 MHz center frequency. The filter bandwidth, both rejection bandwidth and the 3 dB bandwidth, grow as the notch is tuned to higher frequencies. The minimum rejection bandwidth, 4.4 MHz at the 40 dB point at 500 MHz center frequency, and the maximum 3 dB bandwidth of 220 MHz occurring at the high end of the tuning range at 2600 MHz can be seen in FIGS. 8-11.

Figure 7:
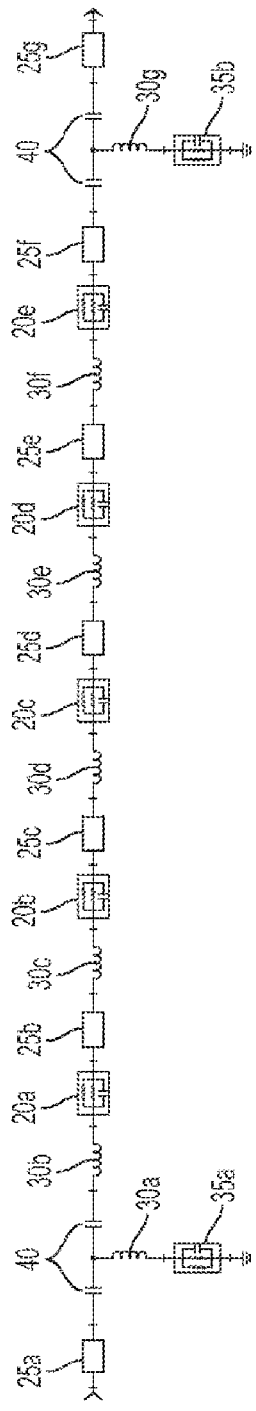
FIG. 7 shows an example schematic drawing of a seven stage tuned YIG band reject filter, configured according to principles of the invention.

FIG. 7 shows an example schematic drawing of a seven stage YIG-tuned band reject filter, configured according to principles of the invention. The filter 120 of FIG. 7 uses two shunt resonators 35a and 35b in order to achieve a much wider minimum rejection bandwidth. Essentially, the first and last YIG resonator of FIG. 6 have been replaced by shunt YIG resonators 35a and 35b. The filter 120 of FIG. 7 is a still seven stage YIG-tuned filter, albeit improved, but now comprising five serially connected YIG resonators 20a-20e, two shunt resonators 35a, 35b, series resonator coupling loop inductors 30b-30f, shunt resonator loop inductors 30a, 30g, matching capacitors 40, and input-output matching lines 25a and 25g. Using this topology, several prototypes were built and tested, all of the serially connected resonators are very de-coupled relative to how tightly they were coupled in regard to circuit 100 of FIG. 6 in order to achieve the needed bandwidth in the filter 100 of FIG. 6.

In the filter 120 that is configured with shunt resonators 35a, 35b, the interior five serially connected resonators 20a-20e contribute very little to the low end (500 MHz) rejection bandwidth, while still having usable bandwidth at the high end, i.e., about 2600 MHz. The input and output shunt resonators 35a, 35b have a very wide and deep notch at 500 MHz (FIG. 5A) relative to the shallow notch of the prior art resonator (as shown in FIG. 4A). This may assure that the 500 MHz notch depth and notch bandwidth of the full seven stage YIG tuned band reject filter 120 are very deep and wide even though all the series resonators 20a-20e are very decoupled to minimize the tracking spur contributions as the filter 120 tunes towards to upper band frequencies and finally to about 2600 MHz. So, the normally very tight coupling needed to achieve wide minimum rejection bandwidth with a prior art series connected YIG tuned band reject filter is no longer needed once the end serial resonator(s) are replaced by a shunt resonator (e.g., 35a, 35b), according to principles of the invention. Now, very light coupling may be used on the serial resonators (e.g., 20a-20e), thereby greatly reducing the amplitude of the tracking spurs that widen the 3 dB bandwidth over most of the tuning band. The very low end (e.g., 500 MHz) rejection bandwidth due to the five serially connected resonators 20a-20e is compensated for by the very deep notch depth and wide rejection bandwidth that the two shunt resonators 35a, 35b contribute.

The frequency response (S21) of filter 120 is shown as line 130 and the frequency response of filter 100 of the prior art is shown as line 135 at multiple frequencies in FIGS. 8-11. The two frequency responses overlap. Although a 500 MHz-2600 MHz prototype unit was constructed (i.e., filter 120) and tested to demonstrate the principles of the invention, the principles of the invention are not limited to this frequency range (i.e., 500 MHz-2600 MHz). Rather, the principles of the invention may provide a substantial improvement over the prior art at any frequency range that a YIG-tuned band reject filter, or similar YIG based devices, can be implemented.

The minimum rejection bandwidth at 500 MHz of filter 120 of FIG. 7 is about 8.7 MHz, twice that of the prior art filter 100 of FIG. 6 which is about 4.4 MHz at the 40 dB rejection point. At the same time, the maximum 3 dB bandwidth of the filter 120 of FIG. 7 is less than half that of the prior art filter 100 of FIG. 6. The prior art filter 100 has a 3 dB bandwidth of about 220 MHz at 2600 MHz, and the filter 120 of FIG. 7 has a 3 dB bandwidth of only about 103 MHz at 2600 MHz.

The plots of FIGS. 8-11 (i.e., lines 130, 135) were recorded by conventional lab test equipment (not shown) which had limited dynamic range. The test equipment employed to measure the frequency responses shown in FIGS. 8-11 included: a HP 8350B Sweep Oscillator, a HP8757C Scalar Network Analyzer, a HP 6205C Dual DC power supply, and an XL Microwave Sweeping Current Supply. Minimum notch depth was measured with an Agilent N5320C Network Analyzer; the minimum notch depth, for the filter 120 as plotted in FIGS. 8-11, occurring at 500 MHZ center frequency is 75 dB.

Figure 8:
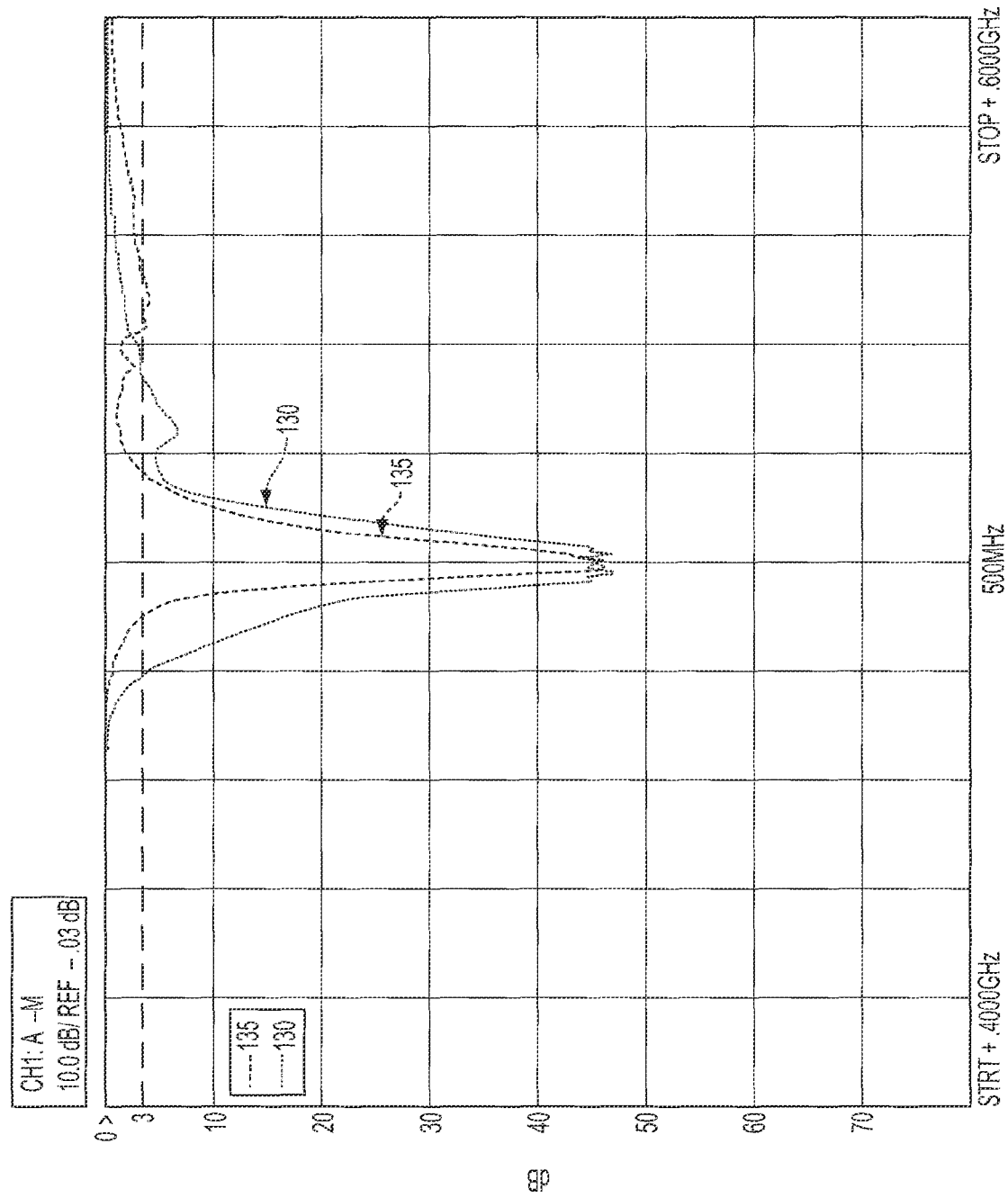
FIG. 8 shows the measured frequency response of the conventional YIG tuned band reject filter of FIG. 6, and also the measured frequency response of the seven stage tuned YIG band reject filter of FIG. 7, centered at about 500 MHz.

FIG. 8 shows the measured frequency response of the conventional YIG tuned band reject filter of FIG. 6, and also the measured frequency response of the seven stage tuned YIG band reject filter of FIG. 7, across a frequency range of about 0.4000 GHz to about 0.6000 GHz, centered at about 500 Mhz. The performance of the filter 120 of FIG. 7 is shown in FIG. 8 as line 130, while the performance of the conventional seven sphere YIG band reject filter 100 of FIG. 6 is shown as line 135. The line 135 of the conventional seven stage filter of FIG. 6 may have a resulting 3 dB notch bandwidth of about 27 MHz and a 40 dB notch bandwidth of about 4.4 MHz. In comparison, the line 130 of the filter 120 of FIG. 7 may have a resulting 3 dB notch bandwidth of about, e.g., 59 MHz and a 40 dB notch bandwidth of about, e.g., 8.7 MHz. The notch depth of the conventional seven stage filter 100 of FIG. 6 may be about 48 dB, while the actual notch depth of the tunable shunt YIG tuned band reject filter 120 of FIG. 7 may actually exceed 75 dB.

Figure 9:
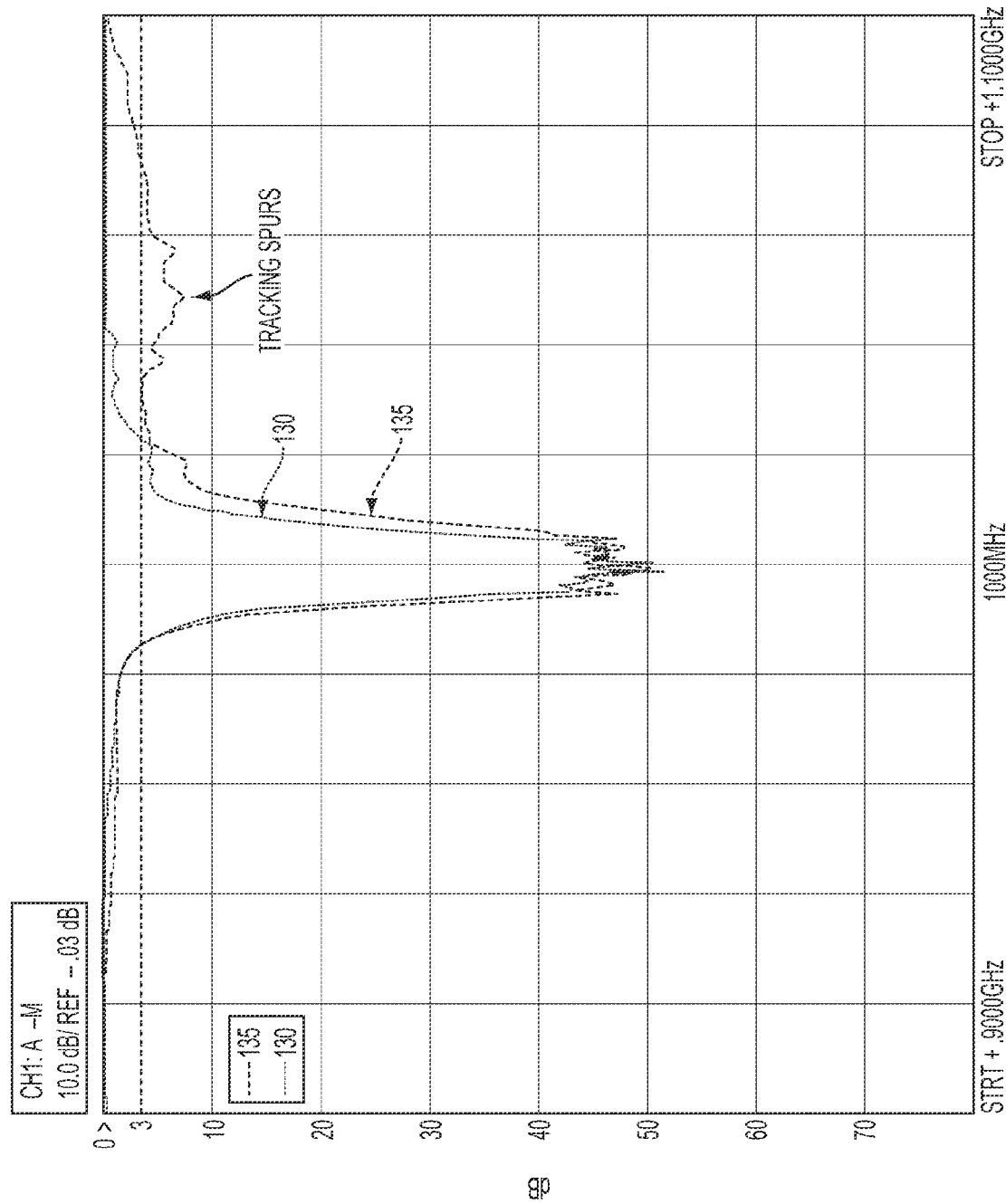
FIG. 9 shows the measured frequency response of the conventional YIG tuned band reject filter of FIG. 6, and also the measured frequency response of the seven stage tuned YIG band reject filter of FIG. 7, centered at about 1000 MHz.

FIG. 9 shows the measured frequency response of the conventional YIG tuned band reject filter 100 of FIG. 6, and also the measured frequency response of the seven stage tuned YIG band reject filter 120 of FIG. 7, across a frequency range of, e.g., about 0.9000 GHz to about 1.1 GHz, centered at about 1000 Mhz. The performance of the filter 120 of FIG. 7 is shown in relation as line 130, while the performance of the conventional seven sphere YIG band reject filter of FIG. 6 is shown as line 135. The line 135 of the conventional seven stage filter 100 of FIG. 6 has a resulting 3 dB notch bandwidth of about, e.g., 96 MHz, and a 40 dB notch bandwidth of about, e.g., 12 Mhz. In comparison, the line 130 of the tunable shunt YIG tuned band reject filter 120 of FIG. 7 may have a resulting 3 dB notch bandwidth of about, e.g., 40 MHz, and a 40 dB notch bandwidth of about, e.g., 10 Mhz.

Figure 10:
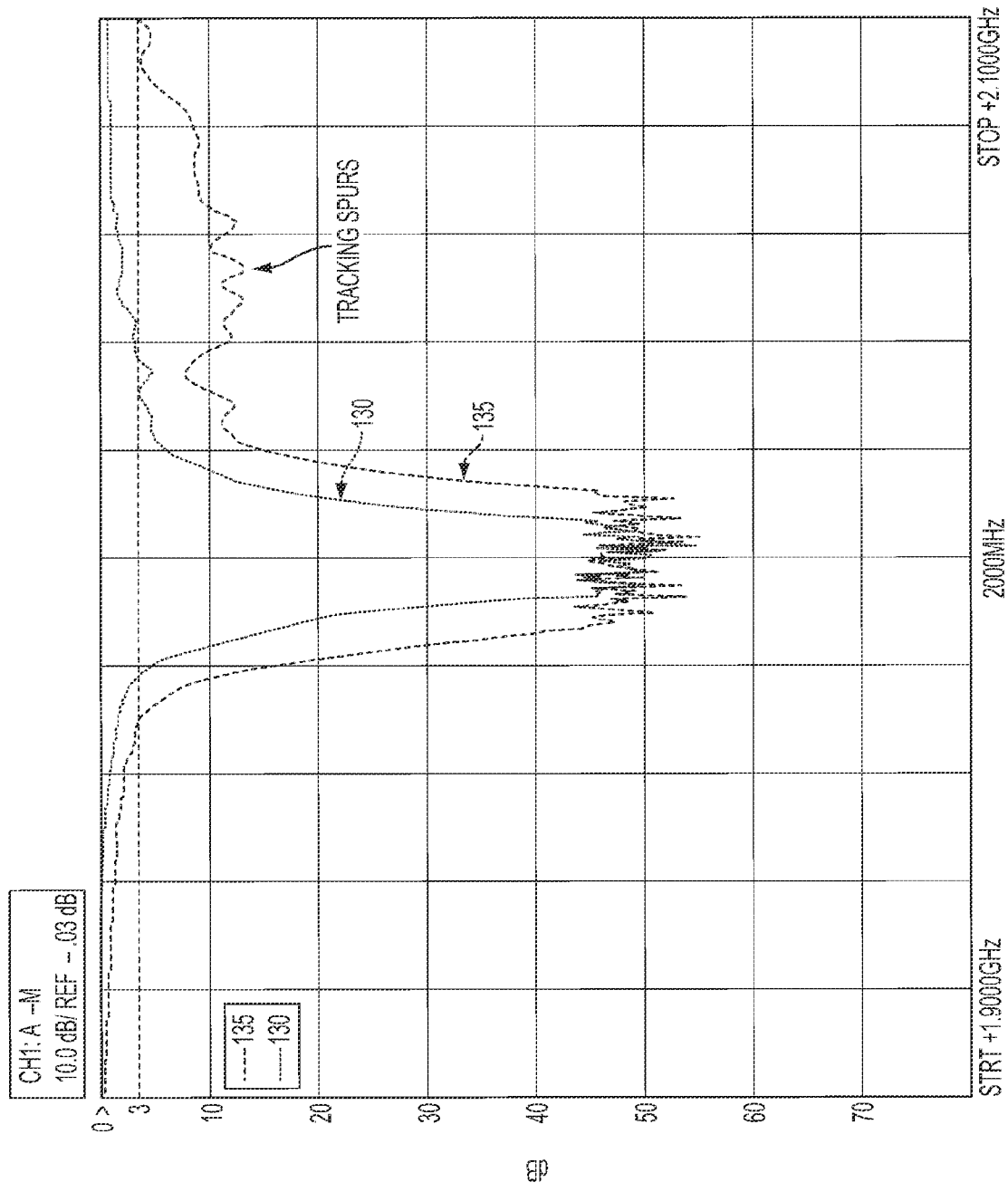
FIG. 10 shows the measured frequency response of the conventional YIG tuned band reject filter of FIG. 6, and also the measured frequency response of the seven stage tuned YIG band reject filter of FIG. 7, centered at about 2000 MHz.

FIG. 10 shows the measured frequency response of the conventional YIG tuned band reject filter 100 of FIG. 6, and also the measured frequency response of the seven stage tuned YIG band reject filter 120 of FIG. 7, across a frequency range of about 1.9000 GHZ to about 2.1000 GHz, centered at about 2000 Mhz. The performance of the filter 120 of FIG. 7 is shown in relation as line 130, while the performance of the conventional seven sphere YIG band reject filter 100 of FIG. 6 is shown as line 135. The line 135 of the conventional seven stage filter 100 of FIG. 6 may have a resulting 3 dB notch bandwidth of about, e.g., 135 MHz, and a 40 dB notch bandwidth of about, e.g., 27 Mhz. In comparison, the line 130 of the tunable shunt YIG tuned band reject filter 120 of FIG. 7 may have a resulting 3 dB notch bandwidth of about, e.g., 67 MHz, and a 40 dB notch bandwidth of about, e.g. 15 Mhz.

Figure 11:
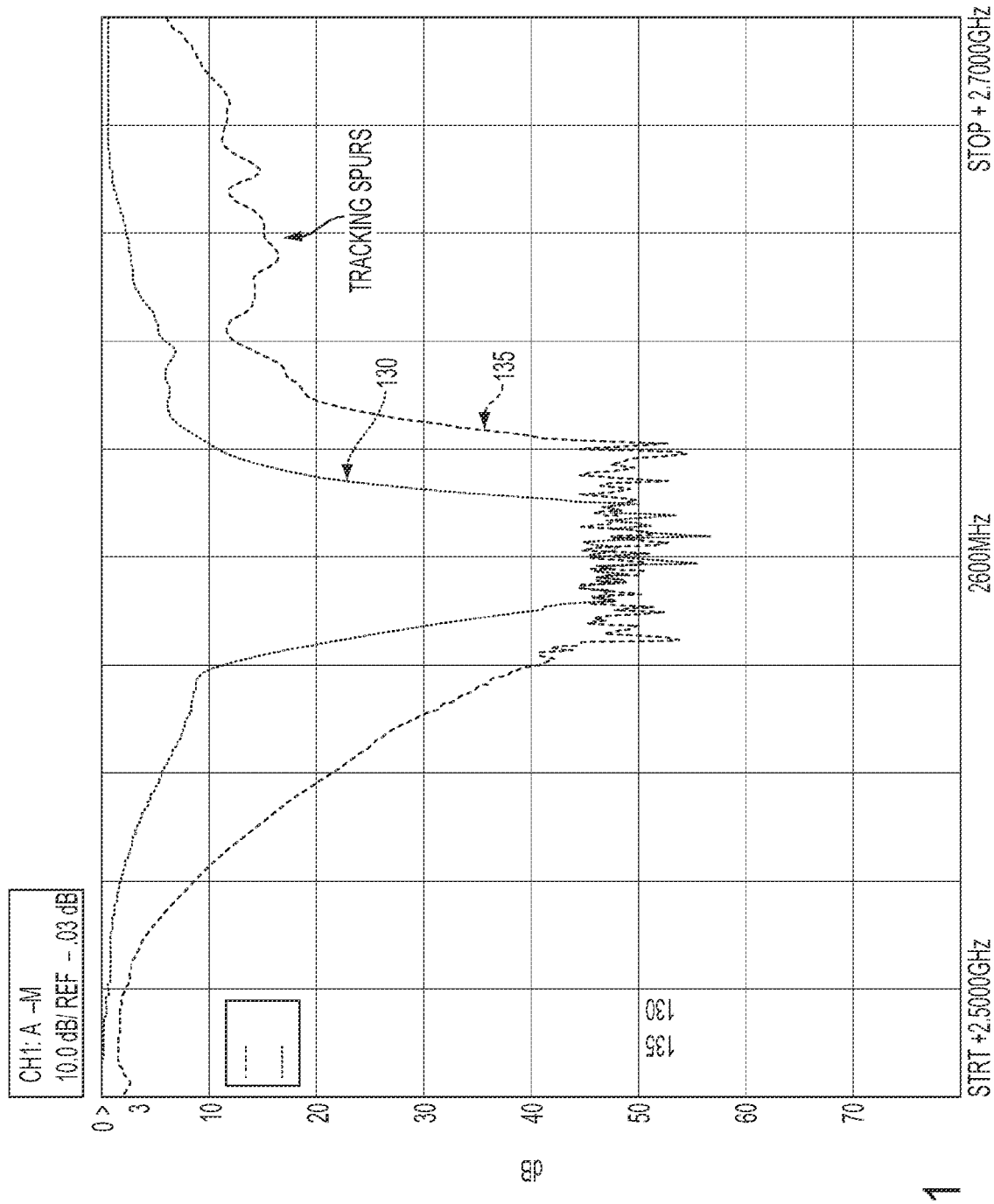
FIG. 11 shows the measured frequency response of the conventional YIG tuned band reject filter of FIG. 6, and also the measured frequency response of the seven stage tuned YIG band reject filter of FIG. 7, centered at about 2600 MHz.

FIG. 11 shows the measured frequency response of the conventional YIG tuned band reject filter 100 of FIG. 6, and also the measured frequency response of the seven stage tuned YIG band reject filter 120 of FIG. 7, across frequency range of about 2.5000 GHz to about 2.7000 GHz, centered at about 2600 MHz. The performance of the filter 120 of FIG. 7 is shown in relation as line 130, while the performance of the conventional seven sphere YIG band reject filter 100 of FIG. 6 is shown as line 135. The line 135 of the conventional seven stage filter 100 of FIG. 6 may have a resulting 3 dB notch bandwidth of about, e.g., 220 MHz, and a 40 dB notch bandwidth of about, e.g., 43 Mhz. In comparison, the line 130 of the tunable shunt YIG tuned band reject filter 120 of FIG. 7 may have a resulting 3 dB notch bandwidth of about, e.g., 103 MHz, and a 40 dB notch bandwidth of about, e.g., 21 Mhz.

Figure 12:
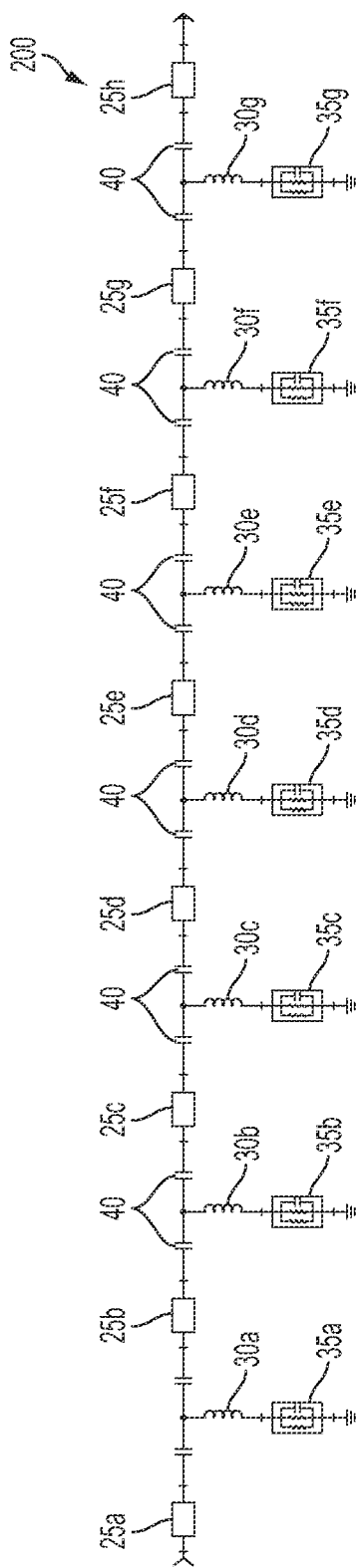
FIG. 12 shows an example of a schematic of a tunable shunt YIG tuned band reject filter, configured according to principles of the invention.

FIG. 12 shows a schematic of a YIG tuned band reject filter 200, configured according to principles of the invention. The filter 200 comprises all shunt resonators 35a-35g, impedance inverters 25b-25g, input-output matching lines 25a and 25h, capacitors 40 and shunt resonator loop inductors 30a-30g.

Figure 13:
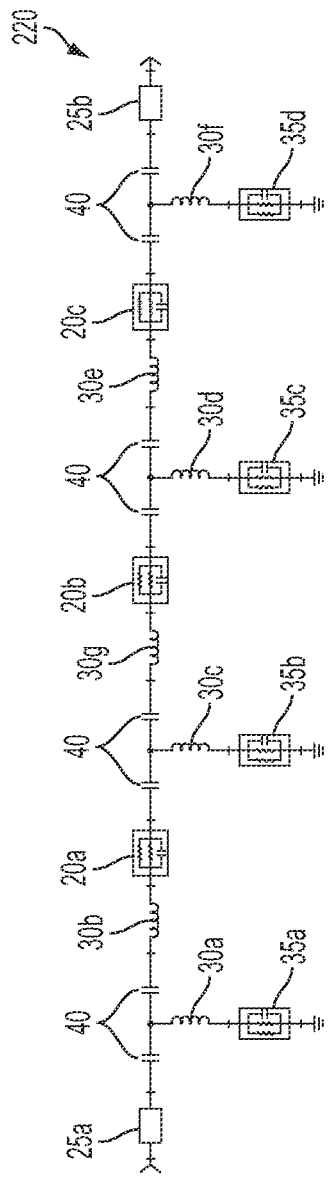
FIG. 13 shows an example of a schematic of a tunable shunt YIG tuned band reject filter, configured according to principles of the invention.

FIG. 13 shows a schematic of YIG tuned band reject filter 220, configured according to principles of the invention. The filter 220 may comprise alternating shunt and series YIG resonators. The filter 220 may comprise shunt resonators 35a-35d, shunt resonator coupling loop inductors 30a, 30c, 30d, 30f, series resonators 20a-20c, coupling loop inductors 30b, 30g and 30e and input-output matching lines 25a and 25h.

The configuration of FIGS. 12 and 13 are examples of other topologies that are possible using principles of the invention. Other topologies are also contemplated.

The tunable shunt YIG resonator examples described herein may also require commonly known supporting circuitry which might include, for example: a power source, a signal acquisition circuit, a processor, an output, and the like, to implement the principles herein, as one of ordinary skill would understand. The tunable shunt YIG resonators may be employed in most applications that might warrant the use of tunable microwave filters. Moreover, the tunable shunt YIG resonators may be employed in other types of circuits such as, e.g., band pass filters or oscillators, or the like. The various shunt YIG filters described herein may be utilized in many types of application elements, e.g., in such devices as Tunable Oscillators (YIG Oscillators) and Tunable Filters (YIG Filters). The applications may include a device that may include a tunable shunt YIG filter (e.g., circuit 120, 200, 220, or variation thereof). The device may include, but not limited to, e.g., a communication device, a signal processing device, a microwave device, a wireless transmission device, a wireless reception device, an imaging device, or the like.

While the invention has been described in terms of exemplary examples, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. A filter, comprising:
   a plurality of Yttrium Iron Garnet (YIG) resonators arranged in series; and
   at least one YIG resonator configured as at least one shunt resonator to the plurality of YIG resonators arranged in series to provide a filter that is tunable over a multi octave range;
   wherein the at least one shunt resonator is tunable by ferrimagnetic resonance.

2. The filter of claim 1, wherein the plurality of YIG resonators comprise a plurality of stages of a band reject filter.

3. The filter of claim 2, wherein each stage includes an impedance inverter.

4. The filter of claim 3, wherein each stage further includes at least one of an inductor and a capacitor.

5. The filter of claim 3, wherein the inverter comprises a quarter wave impedance inverter.

6. The filter of claim 2, wherein each stage includes at least one of an inductor and a capacitor.

7. The filter of claim 1, wherein the filter comprises a band reject filter.

8. The filter of claim 1, wherein said at least one shunt resonator is configured as a shunt resonator to ground.

9. The filter of claim 1, wherein said at least one shunt resonator comprises an end shunt resonator.

10. The filter of claim 1, wherein said at least one shunt resonator comprises two YIG resonators each configured as an end shunt resonator.

11. The filter of claim 1, wherein said at least one shunt resonator comprises a shunt resonator, the shunt resonator configured to be connected between two of the series YIG resonators.

12. The filter of claim 1, wherein said at least one shunt resonator comprises a plurality of shunt resonators, at least one of the plurality of shunt resonators connected between at least one pair of said plurality of YIG resonators.

13. The filter of claim 1, wherein said at least one shunt resonator comprises a plurality of shunt resonators, each of the plurality of shunt resonators connected between different pairs of said plurality of YIG resonators.

14. The filter of claim 1, wherein the filter comprises a band reject filter having a notch that decreases in depth as frequency increases.

15. The circuit of claim 14, wherein the filter comprises a band reject filter having a low impedance at resonance and a wider minimum rejection bandwidth while having a narrower maximum 3 db bandwidth, as compared with a series only YIG filter.

16. A filter, comprising:
    a plurality of impedance inverters in series; and
    at least one shunt Yttrium Iron Garnet (YIG) resonator connected between at least two of the plurality of impedance inverters to provide a filter that is tunable over a multi octave range;
    wherein the shunt YIG resonator is tunable by ferrimagnetic resonance.

17. The filter of claim 16, further comprising at least one of: a capacitor and an inductor connected between the at least one shunt YIG resonator and at least one of the two impedance inverters.

18. The filter of claim 16, further comprising at least one shunt resonator connected in series with the plurality of impedance inverters.

19. The filter of claim 16, wherein at least one of the plurality of inverters comprises a quarter wave impedance inverter.

20. The filter of claim 16, wherein the plurality of impedance inverters comprises at least three impedance inverters and the at least one shunt YIG resonator comprises at least two shunt YIG resonators, each of the at least two shunt YIG resonators is connected between a respective pair of said plurality of impedance inverters.

21. The filter of claim 16, wherein the filter comprises a band reject filter.

22. A device utilizing the circuit of claim 1, wherein the device comprises one of a communication device, a signal processing device, a microwave device, a wireless transmission device, a wireless reception device or an imaging device.

23. A device utilizing the circuit of claim 16, wherein the device comprises one of a communication device, a signal processing device, a microwave device, a wireless transmission device, a wireless reception device or an imaging device.

24. A filter comprising:
    a plurality of Yttrium Iron Garnet (YIG) resonators arranged in series; and at least one YIG resonator configured as at least one shunt resonator to the plurality of YIG resonators arranged in series to provide a filter that is tunable over a multi octave range, wherein the at least one shunt resonator is tunable by ferrimagnetic resonance; and wherein the tunable filter provides a notch that decreases in depth and width as frequency increases.

25. The filter of claim 24, wherein the filter provides a minimum rejection bandwidth that increases while the maximum 3 dB notch bandwidth over a tuning band decreases.

* * * * *